United States Patent
Ahmed et al.

(10) Patent No.: US 9,730,165 B2
(45) Date of Patent: Aug. 8, 2017

(54) TECHNIQUES FOR MODIFYING TRANSCEIVER POWER DURING DIGITAL PRE-DISTORTION TRAINING

(71) Applicant: QUALCOMM Incorporated, San Diego, CA (US)

(72) Inventors: Walid Khairy Mohamed Ahmed, Tinton Falls, NJ (US); Ori Auslender, Tel Aviv (IL); Victor Alexander Abramsky, Edison, NJ (US); Prashanth Hande, Somerset, NJ (US); Ran Iron, Tel Aviv (IL); Yeuda Raz, Hod-Hasaron (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/993,793

(22) Filed: Jan. 12, 2016

(65) Prior Publication Data
US 2017/0201952 A1    Jul. 13, 2017

(51) Int. Cl.
*H04B 1/04*    (2006.01)
*H04W 52/24*   (2009.01)
*H04B 1/62*    (2006.01)

(52) U.S. Cl.
CPC ............ *H04W 52/244* (2013.01); *H04B 1/62* (2013.01)

(58) Field of Classification Search
CPC .................................................. H04W 52/244
(Continued)

(56) References Cited

U.S. PATENT DOCUMENTS 5,627,857 A * 5/1997 Wilson .................. H03F 1/3241
                                                    375/219
6,286,994 B1 * 9/2001 Boesel ................ H04W 52/225
                                                    374/146
(Continued)

FOREIGN PATENT DOCUMENTS

CN    100571443 C    12/2009
CN    104 159 282 A  11/2014
EP    2 563 078 B1    5/2014

OTHER PUBLICATIONS

Ericsson: "On BS ACLR and UEM requirements," 3GPP Draft; R4-140889, $3^{RD}$ Generation Partnership Project (3GPP), Mobile Competence Centre; 650, Route Des Lucioles; F-06921 Sophia-Antipolis Cedex; France, vol. Ran WG4, No. Prague, Czech Republic; 20140210-20140214; Feb. 9, 2014, XP050740528, 3 pages. Retrieved from the Internet: URL: http://www.3gpp/ftp/Meetings_3GPP_SYNC/Ran/RAN4/Docs/ [retrieved on Feb. 9, 2014].
International Search Report and Written Opinion—PCT/US2017/012545—ISA/EPO—Mar. 30, 2017. 15 pages.

*Primary Examiner* — Sanh Phu
(74) *Attorney, Agent, or Firm* — Arent Fox LLP

(57) ABSTRACT

Various aspects described herein relate to adjusting transmit power of a radio frequency (RF) transceiver. A total power adjustment for adjusting a transmit power of the RF transceiver can be determined. The transmit power can be adjusted to a first adjusted transmit power based at least in part on a first adjustment size that is less than the total power adjustment and determined based at least in part on the transmit power. Digital pre-distortion (DPD) training of the RF transceiver can be performed to adjust one or more coefficients for calibrating the RF transceiver based on the first adjusted transmit power. The first adjusted transmit power can be adjusted to a second adjusted transmit power based at least in part on a second adjustment size that is less (Continued)

than the total power adjustment and computed based at least in part on the first adjusted transmit power.

30 Claims, 8 Drawing Sheets

(58) Field of Classification Search
USPC .................................................... 455/114.3
See application file for complete search history.

(56) References Cited

U.S. PATENT DOCUMENTS

| | | | |
|---|---|---|---|
| 7,945,215 B2 | | 5/2011 | Tang |
| 8,718,178 B1 * | | 5/2014 | Carbone .................. H03D 1/04 |
| | | | 375/285 |
| 2007/0223621 A1 * | | 9/2007 | Ahmed ................ H03F 1/3247 |
| | | | 375/296 |
| 2012/0115531 A1 * | | 5/2012 | Gaal ........................ H04B 7/04 |
| | | | 455/522 |
| 2012/0194271 A1 | | 8/2012 | Yamamoto et al. |
| 2012/0224654 A1 * | | 9/2012 | Nagatani .............. H04B 1/0475 |
| | | | 375/297 |
| 2013/0040675 A1 | | 2/2013 | Antò et al. |
| 2014/0133531 A1 * | | 5/2014 | Nguyen ................ H04L 27/367 |
| | | | 375/219 |
| 2015/0094114 A1 | | 4/2015 | Rao et al. |
| 2015/0141031 A1 | | 5/2015 | Chen et al. |

* cited by examiner

TECHNIQUES FOR MODIFYING TRANSCEIVER POWER DURING DIGITAL PRE-DISTORTION TRAINING

INTRODUCTION

Described herein are aspects generally related to communication systems, and more particularly, to calibrating transceivers in wireless communications.

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. The wireless devices typically include a user equipment (UE), such as a mobile device, that communicates with a base station to receive access to a wireless network. Small cell base stations are provided as well to provide additional coverage areas. Small cell base stations are typically coupled to an Internet backend (e.g., at a residence, office building, etc.) and provide a frontend radio access network (RAN) interface. Some small cell base stations are capable of self-organization by adjusting transmit power when in proximity of other small cell base stations so as not to interfere with the other small cell base stations. Upon power-up or other detected events, a small cell base station may measure signals from surrounding small cell base stations and provide the signal measurements to a self-organizing algorithm, which may operate at the small cell base station or a centralized entity. Based on the signal measurements, a transmit power and/or power adjustment value is computed for the small cell base station (e.g., by a self-organizing network (SON) or other upper layer functionality), and provided to the small cell base station for adjusting its transmit power (e.g., by adjusting one or more power amplifiers of a transceiver of the small cell base station) to operate in the wireless network without causing substantial interference to neighboring small cell base stations.

The small cell base station can accordingly adjust the transmit power. If the transmit power is adjusted in a single adjustment based on the adjustment value, however, the transmit power adjustment may result in adjacent channel leakage ratio (ACLR) violations defined by the radio access technology (RAT) by which the network and small cell base station operate. If the small cell base station adjusts the transmit power using a fixed adjustment size to avoid ACLR violations, it is possible that the process will not be as efficient as possible, as the adjustment sizes may be too small. Accordingly, techniques are desirable that provide for the appropriate transmit power adjustment without ACLR violations.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

According to an example, a method for adjusting transmit power of a radio frequency (RF) transceiver is provided. The method includes determining a total power adjustment for adjusting a transmit power of the RF transceiver, adjusting the transmit power to a first adjusted transmit power based at least in part on a first adjustment size that is less than the total power adjustment and determined based at least in part on the transmit power, performing digital pre-distortion (DPD) training of the RF transceiver to adjust one or more coefficients for calibrating the RF transceiver based on the first adjusted transmit power, and adjusting, following performing the DPD training, the first adjusted transmit power to a second adjusted transmit power based at least in part on a second adjustment size that is less than the total power adjustment and computed based at least in part on the first adjusted transmit power.

In other aspects, an apparatus for adjusting transmit power of a radio frequency RF transceiver is provided. The apparatus includes the RF transceiver, at least one processor communicatively coupled with the RF transceiver via a bus for communicating signals in a wireless network, and a memory communicatively coupled with the at least one processor and/or the RF transceiver via the bus. The at least one processor and the memory are operable to determine a total power adjustment for adjusting a transmit power of the RF transceiver, adjust the transmit power to a first adjusted transmit power based at least in part on a first adjustment size that is less than the total power adjustment and determined based at least in part on the transmit power, perform DPD training of the RF transceiver to adjust one or more coefficients for calibrating the RF transceiver based on the first adjusted transmit power, and adjust, following performing the DPD training, the first adjusted transmit power to a second adjusted transmit power based at least in part on a second adjustment size that is less than the total power adjustment and computed based at least in part on the first adjusted transmit power.

In another example, an apparatus for adjusting transmit power of a RF transceiver is provided. The apparatus includes means for determining a total power adjustment for adjusting a transmit power of the RF transceiver, means for adjusting the transmit power to a first adjusted transmit power based at least in part on a first adjustment size that is less than the total power adjustment and determined based at least in part on the transmit power, means for performing DPD training of the RF transceiver to adjust one or more coefficients for calibrating the RF transceiver based on the first adjusted transmit power, and means for adjusting, following performing the DPD training, the first adjusted transmit power to a second adjusted transmit power based at least in part on a second adjustment size that is less than the total power adjustment and computed based at least in part on the first adjusted transmit power.

In other aspects, a computer-readable storage medium including computer-executable code for adjusting transmit power of a RF transceiver is provided. The code includes code for determining a total power adjustment for adjusting a transmit power of the RF transceiver, code for adjusting the transmit power to a first adjusted transmit power based at least in part on a first adjustment size that is less than the total power adjustment and determined based at least in part on the transmit power, code for performing digital predistortion (DPD) training of the RF transceiver to adjust one or more coefficients for calibrating the RF transceiver based on the first adjusted transmit power, and code for adjusting, following performing the DPD training, the first adjusted transmit power to a second adjusted transmit power based at least in part on a second adjustment size that is less than the total power adjustment and computed based at least in part on the first adjusted transmit power.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
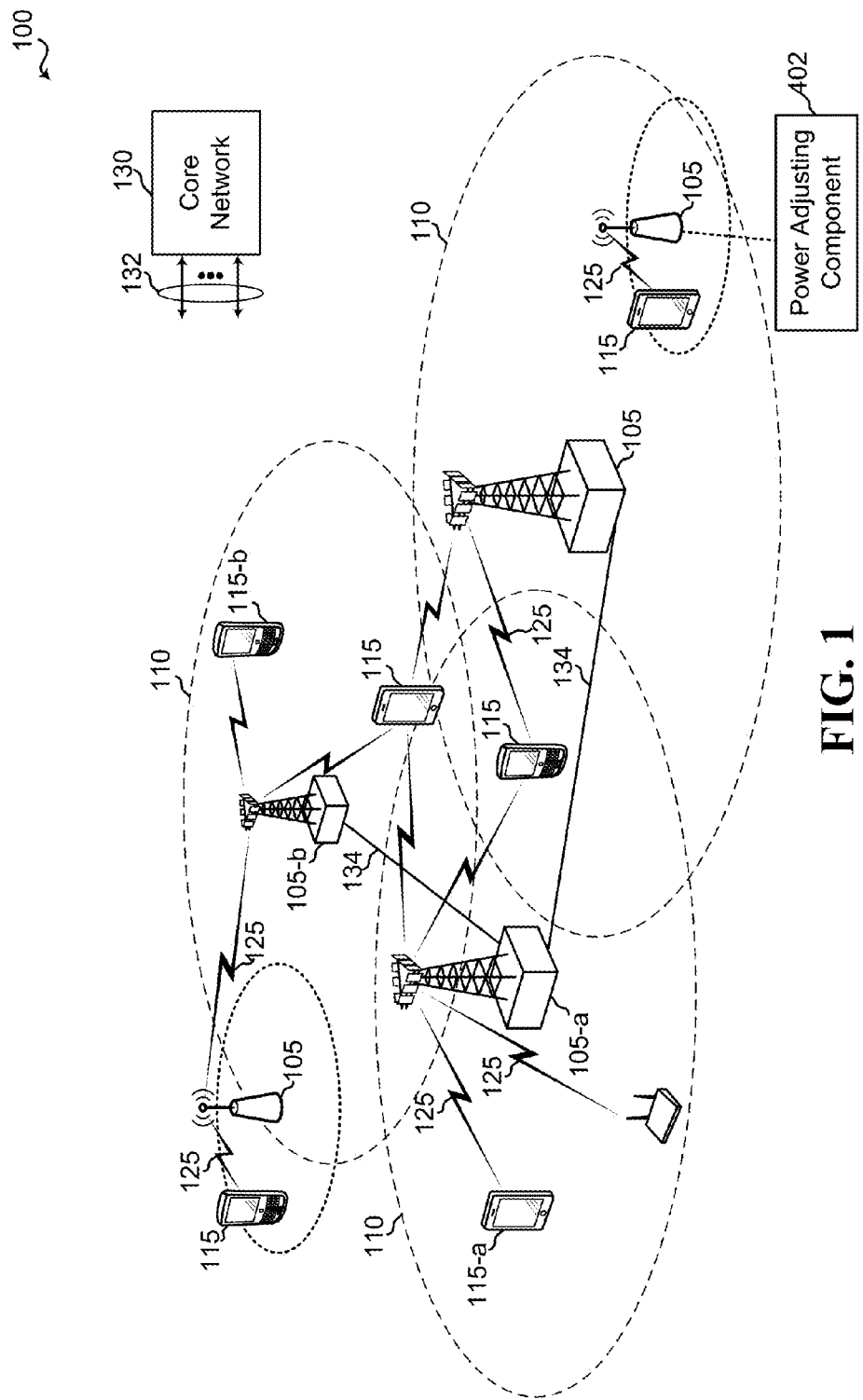
FIG. 1 shows a block diagram conceptually illustrating an example of a telecommunications system, in accordance with aspects described herein.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Described herein are various aspects related to calibration of transmit power of radio frequency (RF) transceivers of wireless devices. For example, a wireless device can adjust transmit power of an RF transceiver by performing multiple incremental or decremental power adjustments to achieve the total power adjustment determined for the RF transceiver. For example, upon receiving a total power adjustment, the wireless device can determine one or more positive or negative adjustment sizes to apply in increasing or decreasing the transmit power to achieve the total power adjustment in multiple power adjustment processes. Accordingly, the wireless device can begin to adjust the transmit power in the appropriate direction (e.g., increasing or decreasing power at a power amplifier) based on an adjustment size(s), can perform digital pre-distortion (DPD) training functions at each power adjustment, and can determine the next adjustment size based on the DPD training and the remaining power adjustment to achieve the total power adjustment.

For example, DPD training can include computing coefficients related to determined distortion in communicating signals over one or more portions of the RF front end (e.g., an in-phase (I) and/or quadrature phase (Q) branch). The RF transceiver can employ the coefficients to predistort transmitted or received signals in the digital domain to account for I/Q imbalance by accordingly adjusting digital and analog gain at the RF transceiver of the wireless device to reduce the distortion to a linear system. For example, wireless devices perform DPD training instead of relying on factory provided coefficients for I/Q imbalance calibration that may not be applicable because of ageing or other operational/environmental changes. When the transmit power of the RF transceiver is modified, the previously used coefficients may become obsolete. Thus, when the power adjustment is beyond a threshold, transmitting with the new transmit power and the previously used coefficients to predistort the signal may result in a transmission by the wireless device that violates an emission specification, such as adjacent channel leakage ratio (ACLR) restrictions, defined for a corresponding radio access technology (RAT).

Thus, given a total power adjustment, the wireless device can adjust the transmit power in multiple adjustments, and can remain at each power adjustment for a period of time that is sufficient to at least allow DPD training and coefficient adjustment at the new transmit power. The wireless device can continue this procedure until the total power adjustment is achieved. At each adjustment, the wireless device can compute a next adjustment size for adjusting the transmit power in a next adjustment, which can be computed based on coefficients adjusted following DPD training at a current adjustment. For example, the wireless device can select the next adjustment size as the largest power increment/decrement possible for the given transmit power and/or digital/analog gain coefficients that do not violate ACLR emission restrictions defined for a corresponding RAT. This allows for efficient transmit power adjustment of the RF transceiver in multiple adjustments to achieve the total power adjustment without violating ACLR restrictions of the RAT. This approach optimizes the process so that the adjustment is performed with the fewest number of adjustments without violating ACLR restrictions for DPD training.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more aspects, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), and floppy disk where disks usually reproduce data magnetically, while discs reproduce data optically with lasers. Combinations of the above should also be included within the scope of computer-readable media.

Referring first to FIG. 1, a diagram illustrates an example of a wireless communications system 100, in accordance with aspects described herein. The wireless communications system 100 includes a plurality of access points (e.g., base stations, eNBs, or WLAN access points) 105, a number of user equipment (UEs) 115, and a core network 130. Access points 105 may include a power adjusting component 402 for adjusting a transmit power of a RF transceiver of the access points 105 in multiple adjustments.

Some of the access points 105 may communicate with the UEs 115 under the control of a base station controller (not shown), which may be part of the core network 130 or the certain access points 105 (e.g., base stations or eNBs) in various examples. Access points 105 may communicate control information and/or user data with the core network 130 through backhaul links 132. In examples, the access points 105 may communicate, either directly or indirectly, with each other over backhaul links 134, which may be wired or wireless communication links. The wireless communications system 100 may support operation on multiple carriers (waveform signals of different frequencies). Multi-carrier transmitters can transmit modulated signals simultaneously on the multiple carriers. For example, each communication link 125 may be a multi-carrier signal modulated according to the various radio technologies described above. Each modulated signal may be sent on a different carrier and may carry control information (e.g., reference signals, control channels, etc.), overhead information, data, etc.

The access points 105 may wirelessly communicate with the UEs 115 via one or more access point antennas. Each of the access points 105 sites may provide communication coverage for a respective coverage area 110. In some examples, access points 105 may be referred to as a base transceiver station, a radio base station, a radio transceiver, a basic service set (BSS), an extended service set (ESS), a NodeB, eNodeB, Home NodeB, a Home eNodeB, or some other suitable terminology. The coverage area 110 for a base station may be divided into sectors making up only a portion of the coverage area (not shown). The wireless communications system 100 may include access points 105 of different types (e.g., macro, micro, femto, and/or pico base stations). The access points 105 may also utilize different radio technologies, such as cellular and/or WLAN radio access technologies (RAT). The access points 105 may be associated with the same or different access networks or operator deployments. The coverage areas of different access points 105, including the coverage areas of the same or different types of access points 105, utilizing the same or different radio technologies, and/or belonging to the same or different access networks, may overlap.

In long term evolution (LTE)/LTE-Advanced (LTE-A) network communication systems, the terms evolved Node B (eNodeB or eNB) may be generally used to describe the access points 105. The wireless communications system 100 may be a Heterogeneous LTE/LTE-A network in which different types of access points provide coverage for various geographical regions. For example, each access point 105 may provide communication coverage for a macro cell, a pico cell, a femto cell, and/or other types of cell. Small cells such as pico cells, femto cells, and/or other types of cells may be provided by small cell base stations as low power nodes or LPNs. A macro cell may generally cover a relatively large geographic area (e.g., several kilometers in radius) and may allow unrestricted access by UEs 115 with service subscriptions with the network provider. In an aspect, as used herein, the term "small cell" may refer to an access point or to a corresponding coverage area of the access point, where the access point in this case has a relatively low transmit power or relatively small coverage as compared to, for example, the transmit power or coverage area of a macro network access point or macro cell. In contrast to a macro cell, a small cell may cover a relatively small geographic area, such as, but not limited to, a home, a building, or a floor of a building. As such, a small cell may include, but is not limited to, an apparatus such as a base station (BS), an access point, a femto node, a femtocell, a pico node, a micro node, a Node B, evolved Node B (eNB), home Node B (HNB) or home evolved Node B (HeNB). Therefore, the term "small cell," as used herein, refers to a relatively low transmit power and/or a relatively small coverage area cell as compared to a macro cell.

As noted above, a small cell may generally cover a relatively smaller geographic area and may allow unrestricted access by UEs 115 with service subscriptions with the network provider, for example, and in addition to unrestricted access, may also provide restricted access by UEs 115 having an association with the small cell (e.g., UEs in a closed subscriber group (CSG), UEs for users in the home, and the like). An eNB for a macro cell may be referred to as a macro eNB. An eNB for a small cell may be referred to as a small cell eNB. An eNB may support one or multiple (e.g., two, three, four, and the like) cells.

The core network 130 may communicate with the eNBs or other access points 105 via one or more backhaul links 132 (e.g., S1 interface, etc.). The access points 105 may also communicate with one another, e.g., directly or indirectly via backhaul links 134 (e.g., X2 interface, etc.) and/or via backhaul links 132 (e.g., through core network 130). The wireless communications system 100 may support synchronous or asynchronous operation. For synchronous operation, the access points 105 may have similar frame timing, and transmissions from different access points 105 may be approximately aligned in time. For asynchronous operation, the access points 105 may have different frame timing, and transmissions from different access points 105 may not be aligned in time.

The UEs 115 are dispersed throughout the wireless communications system 100, and each UE 115 may be stationary or mobile. A UE 115 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a wearable item such as a watch or glasses, a wireless local loop (WLL) station, or the like. A UE 115 may be able to communicate with macro eNBs, small cell eNBs, relays, and the like. A UE 115 may also be able to communicate over different access networks, such as cellular or other WWAN access networks, or WLAN access networks.

The communication links 125 shown in wireless communications system 100 may include uplink (UL) transmissions from a UE 115 to an access point 105, and/or downlink (DL) transmissions, from an access point 105 to a UE 115. The downlink transmissions may also be called forward link transmissions while the uplink transmissions may also be called reverse link transmissions. The communication links 125 may carry transmissions of one or more hierarchical layers which, in some examples, may be multiplexed in the communication links 125. The UEs 115 may be configured to collaboratively communicate with multiple access points 105 through, for example, Multiple Input Multiple Output (MIMO), carrier aggregation (CA), Coordinated Multi-Point (CoMP), multiple connectivity (e.g., CA with each of one or more access points 105) or other schemes. MIMO techniques use multiple antennas on the access points 105 and/or multiple antennas on the UEs 115 to transmit multiple data streams. Carrier aggregation may utilize two or more component carriers on a same or different serving cell for data transmission. CoMP may include techniques for coordination of transmission and reception by a number of access points 105 to improve overall transmission quality for UEs 115 as well as increasing network and spectrum utilization.

Each of the different operating modes that may be employed by wireless communications system 100 may operate according to frequency division duplexing (FDD) or time division duplexing (TDD). In some examples, OFDMA communications signals may be used in the communication links 125 for LTE downlink transmissions for each hierarchical layer, while single carrier frequency division multiple access (SC-FDMA) communications signals may be used in the communication links 125 for LTE uplink transmissions.

As described herein, an access point 105 with a power adjusting component 402 can adjust a transmit power of a RF transceiver in multiple adjustments to prevent violation of ACLR restrictions of a corresponding RAT by the RF transceiver. In addition, the access point 105 can compute an adjustment size for adjusting the transmit power at each adjustment. The access point 105 can perform DPD training after each power adjustment to determine related coefficients (e.g., I/Q imbalance coefficients) after adjusting the transmit power. The access point 105 can then use the coefficients in subsequent adjustment size determination to ensure selection of an adjustment size for the power adjustment that does not violate ACLR requirements of the RAT. In one example, the adjustment sizes can be provided in a look-up table (LUT) that correlates current transmit power to a maximum allowed adjustment size. In another example, the adjustment sizes can be determined based on additional observations, as described herein.

Figure 2:
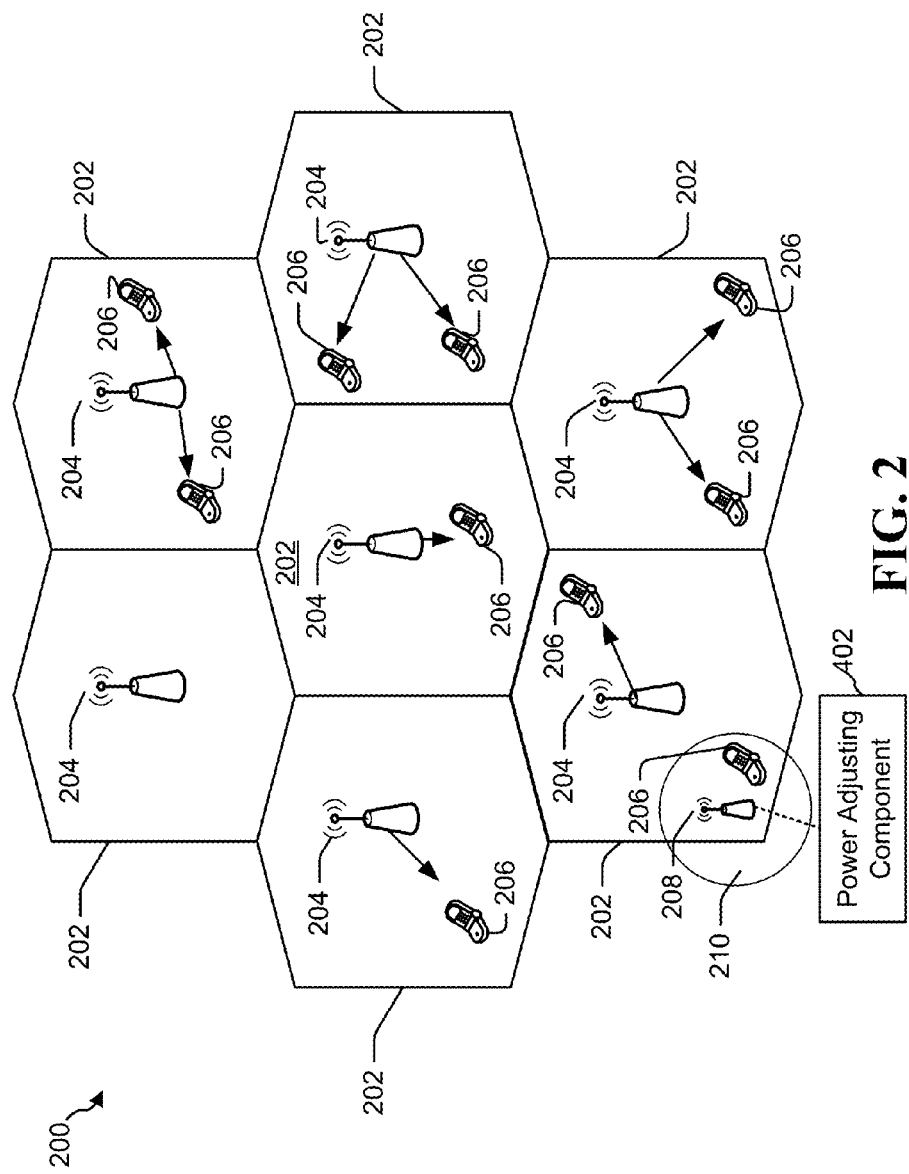
FIG. 2 is a diagram illustrating an example of an access network.

FIG. 2 is a diagram illustrating an example of an access network 200 in an LTE network architecture. In this example, the access network 200 is divided into a number of cellular regions (cells) 202. One or more small cell eNBs 208 (e.g., eNBs of a lower power class than eNBs 204) may have cellular regions 210 that overlap with one or more of the cells 202. The small cell eNB 208 may be a femto cell (e.g., home eNB (HeNB)), pico cell, micro cell, or remote radio head (RRH). The macro eNBs 204 are each assigned to a respective cell 202 and are configured to provide an access point to the core network 130 for all the UEs 206 in the cells 202. One or more of the eNBs 204 or small cell eNBs 208 can include a power adjusting component 402 for adjusting a transmit power of a RF transceiver of the access points 105 in multiple adjustments. There is no centralized controller shown in this example of an access network 200, but a centralized controller may be used in alternative configurations. The eNBs 204 are responsible for all radio related functions including radio bearer control, admission control, mobility control, scheduling, security, and connectivity to a serving gateway (not shown).

The modulation and multiple access scheme employed by the access network 200 may vary depending on the particular telecommunications standard being deployed. In LTE applications, OFDM may be used on the DL and SC-FDMA may be used on the UL to support both frequency division duplexing (FDD) and time division duplexing (TDD). As those skilled in the art will readily appreciate from the detailed description to follow, the various concepts presented herein are well suited for LTE applications. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. These concepts may also be extended to Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), IEEE 802.11 (Wi-Fi), IEEE 802.16 (WiMAX), IEEE 802.20, and Flash-OFDM employing OFDMA. UTRA, E-UTRA, Universal Mobile Telecommunications System (UMTS), LTE and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

The eNBs 204 may have multiple antennas supporting MIMO technology. The use of MIMO technology enables the eNBs 204 to exploit the spatial domain to support spatial multiplexing, beamforming, and transmit diversity. Spatial multiplexing may be used to transmit different streams of data simultaneously on the same frequency. The data steams may be transmitted to a single UE 206 to increase the data rate or to multiple UEs 206 to increase the overall system capacity. This is achieved by spatially precoding each data stream (i.e., applying a scaling of an amplitude and a phase) and then transmitting each spatially precoded stream through multiple transmit antennas on the DL. The spatially precoded data streams arrive at the UE(s) 206 with different spatial signatures, which enables each of the UE(s) 206 to recover the one or more data streams destined for that UE 206. On the UL, each UE 206 transmits a spatially precoded data stream, which enables the eNB 204 to identify the source of each spatially precoded data stream.

Spatial multiplexing is generally used when channel conditions are good. When channel conditions are less favorable, beamforming may be used to focus the transmission energy in one or more directions. This may be achieved by spatially precoding the data for transmission through multiple antennas. To achieve good coverage at the edges of the cell, a single stream beamforming transmission may be used in combination with transmit diversity.

In the detailed description that follows, various aspects of an access network will be described with reference to a MIMO system supporting OFDM on the DL. OFDM is a spread-spectrum technique that modulates data over a number of subcarriers within an OFDM symbol. The subcarriers are spaced apart at precise frequencies. The spacing provides "orthogonality" that enables a receiver to recover the data from the subcarriers. In the time domain, a guard interval (e.g., cyclic prefix) may be added to each OFDM symbol to combat inter-OFDM-symbol interference. The UL may use SC-FDMA in the form of a DFT-spread OFDM signal to compensate for high peak-to-average power ratio (PAPR).

Figure 3:
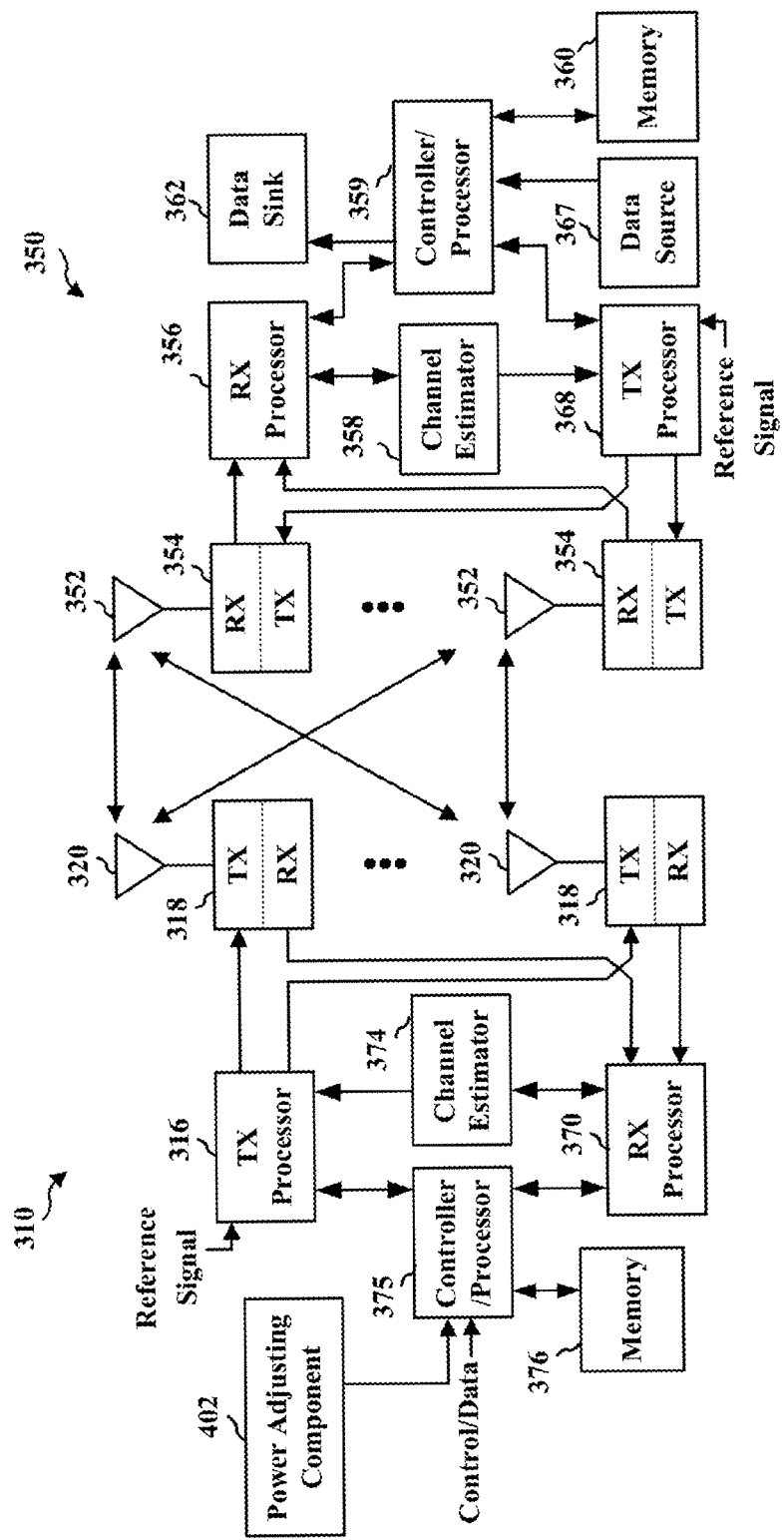
FIG. 3 is a diagram illustrating an example of an evolved Node B and user equipment in an access network.

FIG. 3 is a block diagram of an eNB 310 (e.g., access point 105, eNB 204, small cell eNB 208, eNB 440, eNB 450, eNB 460, etc.) in communication with a UE 350 (e.g., UE 115, 206, etc.) in an access network. In the DL, upper layer packets from the core network are provided to a controller/processor 375. The controller/processor 375 implements the functionality of the L2 layer. In the DL, the controller/processor 375 provides header compression, ciphering, packet segmentation and reordering, multiplexing between logical and transport channels, and radio resource allocations to the UE 350 based on various priority metrics. The controller/processor 375 is also responsible for HARQ operations, retransmission of lost packets, and signaling to the UE 350.

The transmit (TX) processor 316 implements various signal processing functions for the L1 layer (i.e., physical layer). The signal processing functions includes coding and interleaving to facilitate forward error correction (FEC) at the UE 350 and mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream is then provided to a different antenna 320 via a separate transmitter 318TX. Each transmitter 318TX modulates an RF carrier with a respective spatial stream for transmission. In addition, eNB 310 may include a power adjusting component 402 for adjusting a transmit power of a RF transceiver of the eNB 310 in multiple adjustments. For example, power adjusting component 402 can be implemented and/or executed by one or more processors, such as TX processor 316, RX processor 370, controller/processor 375, etc.

At the UE 350, each receiver 354RX receives a signal through its respective antenna 352. Each receiver 354RX recovers information modulated onto an RF carrier and provides the information to the receive (RX) processor 356. The RX processor 356 implements various signal processing functions of the L1 layer. The RX processor 356 performs spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, is recovered and demodulated by determining the most likely signal constellation points transmitted by the eNB 310. These soft decisions may be based on channel estimates computed by the channel estimator 358. The soft decisions are then decoded and deinterleaved to recover the data and control signals that were originally transmitted by the eNB 310 on the physical channel. The data and control signals are then provided to the controller/processor 359.

The controller/processor 359 implements the L2 layer. The controller/processor can be associated with a memory 360 that stores program codes and data. The memory 360 may be referred to as a computer-readable medium. In the UL, the controller/processor 359 provides demultiplexing between transport and logical channels, packet reassembly, deciphering, header decompression, control signal processing to recover upper layer packets from the core network. The upper layer packets are then provided to a data sink 362, which represents all the protocol layers above the L2 layer. Various control signals may also be provided to the data sink 362 for L3 processing. The controller/processor 359 is also responsible for error detection using an acknowledgement (ACK) and/or negative acknowledgement (NACK) protocol to support HARQ operations.

In the UL, a data source 367 is used to provide upper layer packets to the controller/processor 359. The data source 367 represents all protocol layers above the L2 layer. Similar to the functionality described in connection with the DL transmission by the eNB 310, the controller/processor 359 implements the L2 layer for the user plane and the control plane by providing header compression, ciphering, packet segmentation and reordering, and multiplexing between logical and transport channels based on radio resource allocations by the eNB 310. The controller/processor 359 is also responsible for HARQ operations, retransmission of lost packets, and signaling to the eNB 310.

Channel estimates derived by a channel estimator 358 from a reference signal or feedback transmitted by the eNB 310 may be used by the TX processor 368 to select the appropriate coding and modulation schemes, and to facilitate spatial processing. The spatial streams generated by the TX processor 368 are provided to different antenna 352 via separate transmitters 354TX. Each transmitter 354TX modulates an RF carrier with a respective spatial stream for transmission.

The UL transmission is processed at the eNB 310 in a manner similar to that described in connection with the receiver function at the UE 350. Each receiver 318RX receives a signal through its respective antenna 320. Each receiver 318RX recovers information modulated onto an RF carrier and provides the information to a RX processor 370. The RX processor 370 may implement the L1 layer.

The controller/processor 375 implements the L2 layer. The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover upper layer packets from the UE 350. Upper layer packets from the controller/processor 375 may be provided to the core network. The controller/processor 375 is also responsible for error detection using an ACK and/or NACK protocol to support HARQ operations.

Figure 4:
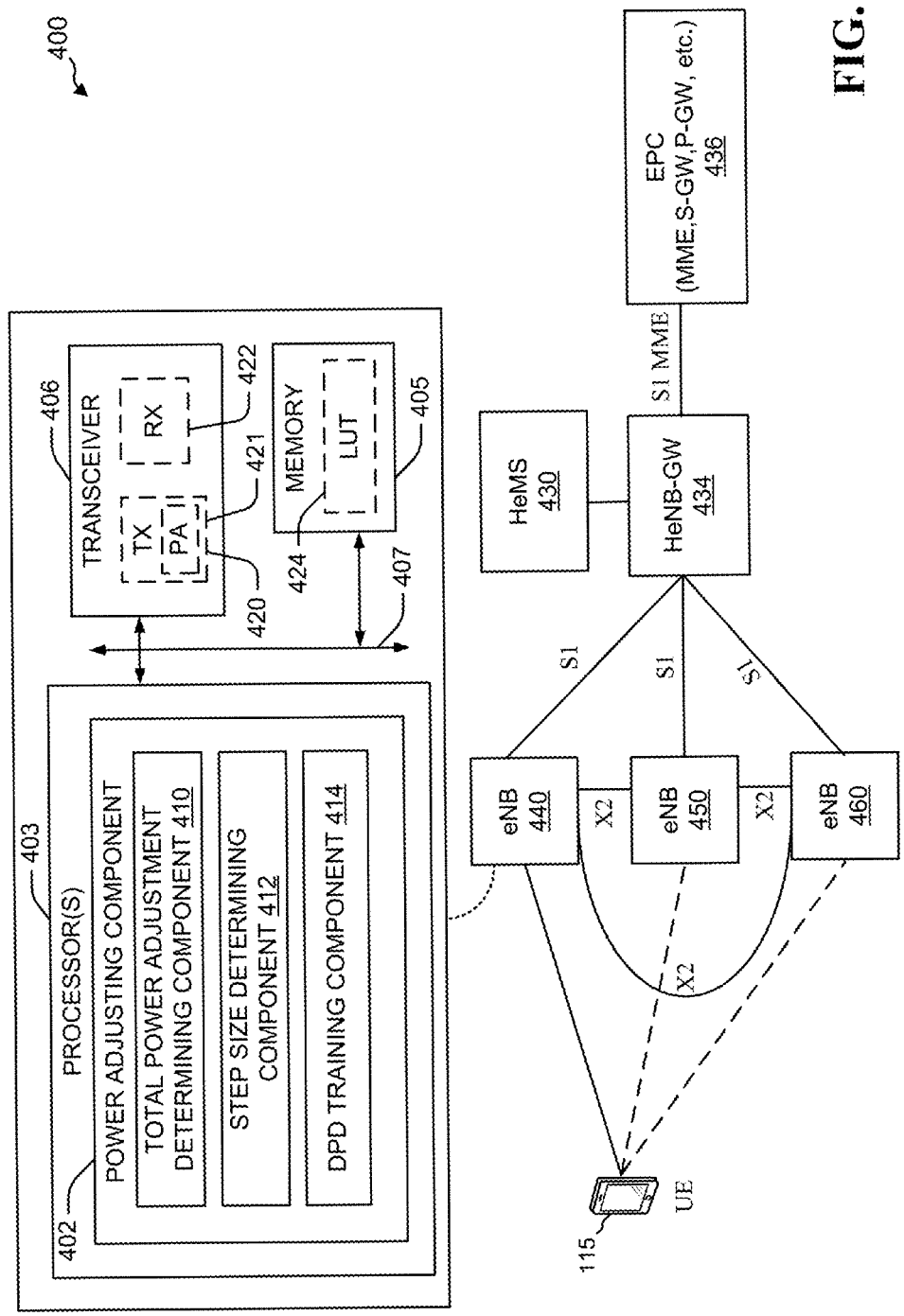
FIG. 4 is a diagram illustrating an example system for adjusting transmit power of a radio frequency (RF) transceiver in accordance with aspects described herein.
Figure 5:
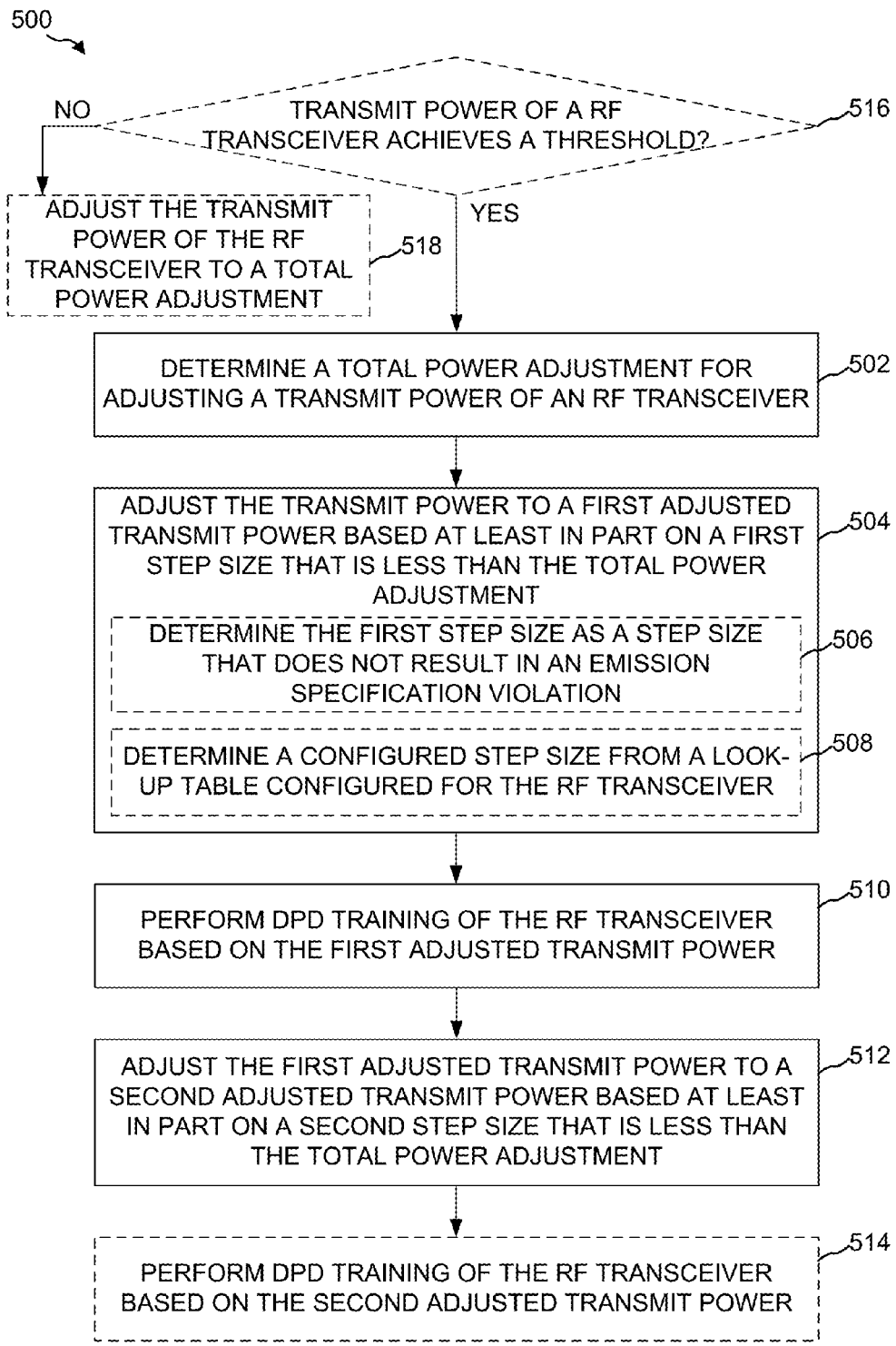
FIG. 5 is a flow chart of an example method of adjusting transmit power of a RF transceiver in accordance with aspects described herein.
Figure 6:
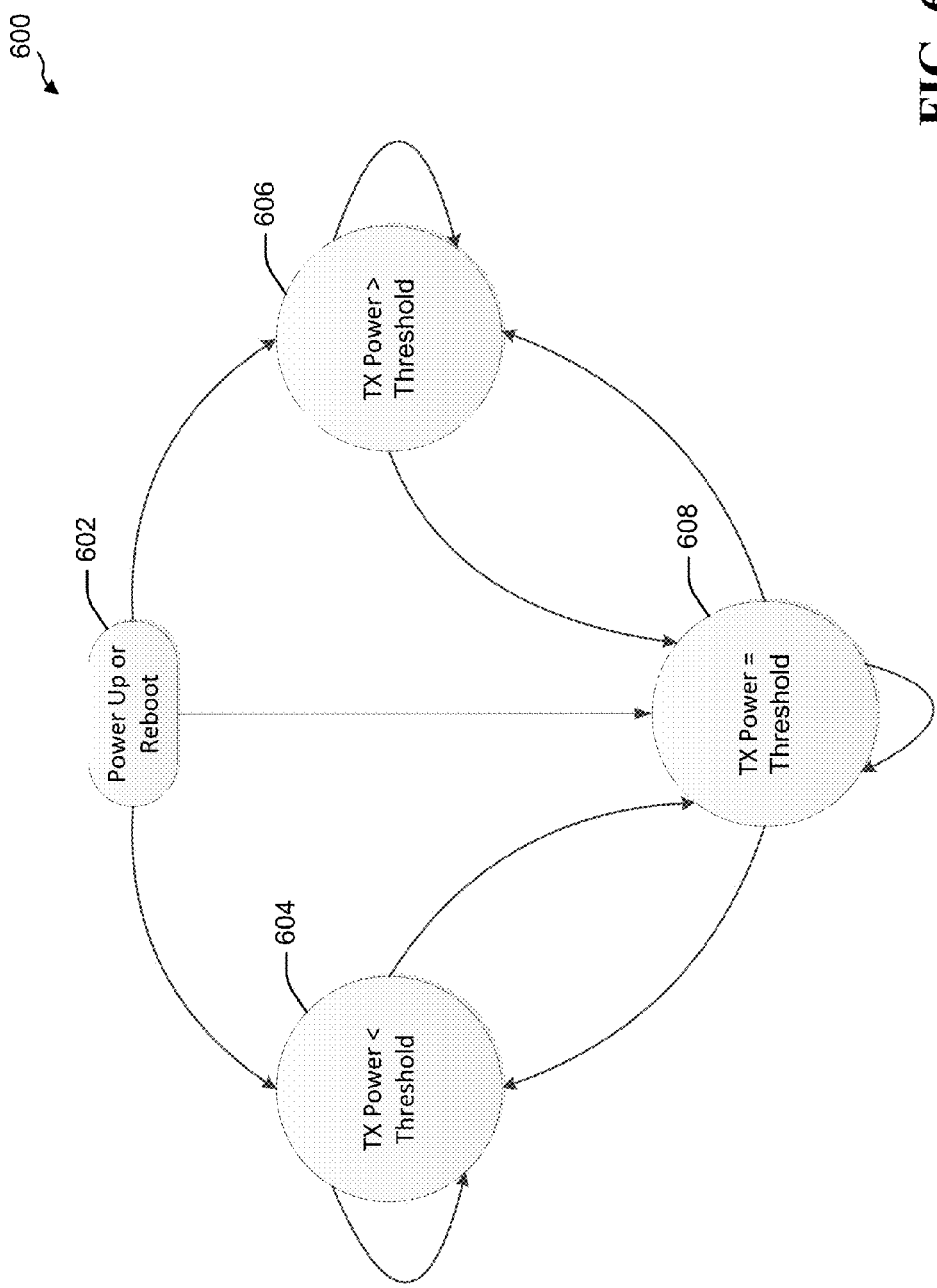
FIG. 6 is a state diagram for adjusting transmit power of a RF transceiver based on comparing a current transmit power to a threshold in accordance with aspects described herein.
Figure 7:
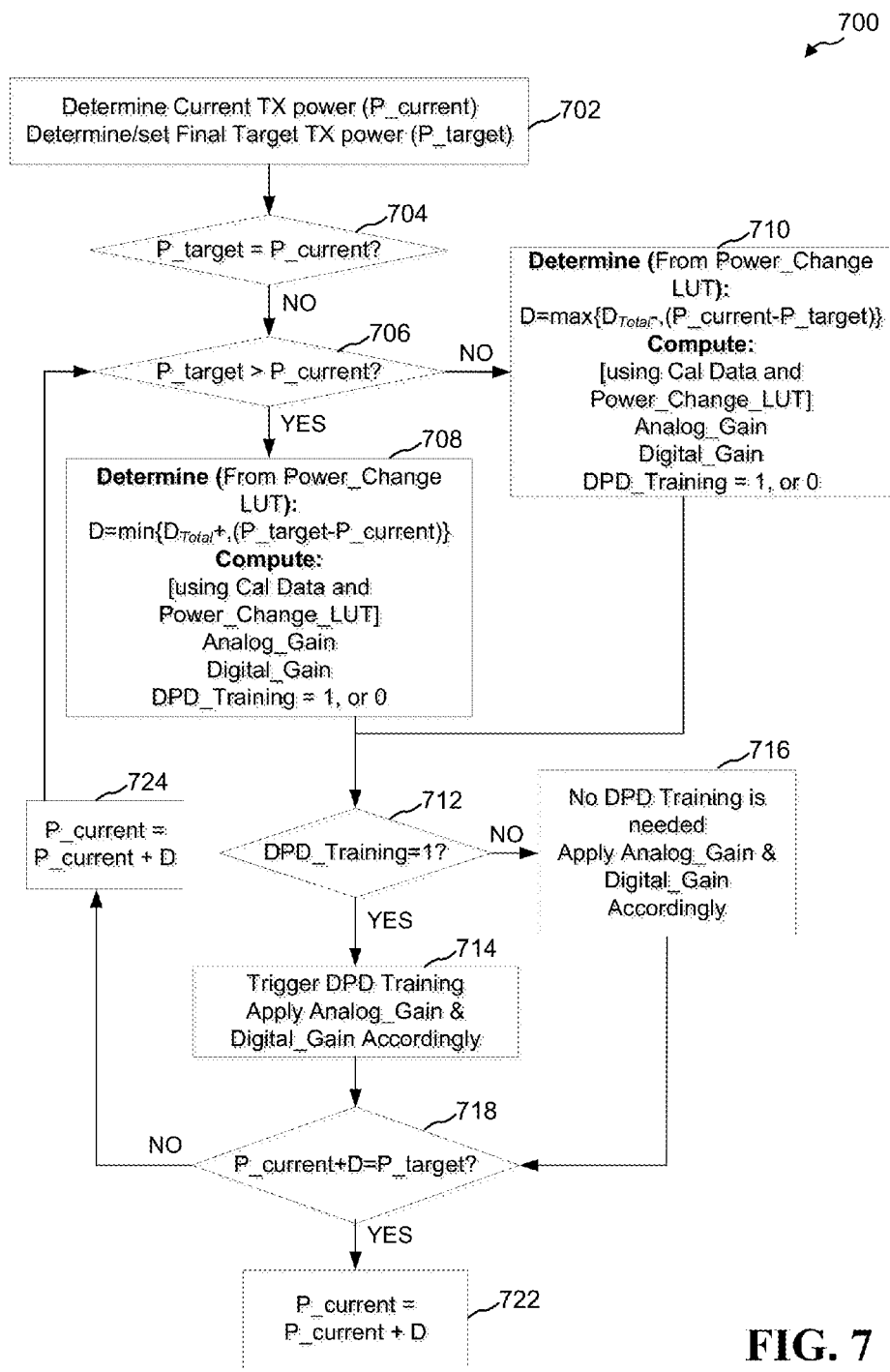
FIG. 7 is a flow chart of an example method of adjusting transmit power of a RF transceiver in accordance with aspects described herein.

Referring to FIGS. 4-7, aspects are depicted with reference to one or more components and one or more methods that may perform the actions or functions described herein. In an aspect, the term "component" as used herein may be one of the parts that make up a system, may be hardware or software or some combination thereof, and may be divided into other components. Although the operations described below in FIGS. 5 and 7 are presented in a particular order and/or as being performed by an example component, it should be understood that the ordering of the actions and the components performing the actions may be varied, depending on the implementation. Moreover, it should be understood that the following actions or functions may be performed by a specially-programmed processor, a processor executing specially-programmed software or computer-readable media, or by any other combination of a hardware component and/or a software component capable of performing the described actions or functions.

FIG. 4 is a block diagram conceptually illustrating an example of a network architecture 400, in accordance with aspects described herein. The network architecture 400 may be part of the wireless communications system 100 of FIG. 1, and may include a home eNB management system (HeMS) 430 capable of handling operation, administration, and management (OAM) of small cell base stations in a home network. The network architecture 400 may also include a home eNB gateway (HeNB-GW) 434, an evolved packet core (EPC) 436 (e.g., a core network, such as core network 130), and one or more eNBs 440, 450, 460. The eNBs 440, 450, 460 may be in communication with the HeNB-GW 434 via backhaul interfaces (e.g., an S1 interface). In an additional or an optional aspect, the eNBs 440, 450, 460 may communicate directly with EPC 436 via S1 interface. UE 115 can be in communication with one or more of eNBs 440, 450, 460. Additionally, the eNBs 440, 450, 460 may communicate with one another over backhaul interfaces (e.g., X2 interfaces). The HeNB-GW 434 and the EPC 436 may communicate via an S1 mobility management entity (MME) interface. The eNBs of FIG. 4 may correspond to one or more of the access points/eNBs described above with respect to FIGS. 1-3.

In an aspect, one or more of the eNBs 440, 450, 460 (though shown and described with respect to eNBs 440 only for ease of explanation) may be configured to adjust transmit power according to aspects described herein. Accordingly, eNBs 440 may include one or more processors 403 and/or a memory 405 that may be communicatively coupled, e.g., via one or more buses 407, and may operate in conjunction with or otherwise implement a power adjusting component 402 configured to adjust a transmit power of an RF transceiver of the eNB 440 and/or related RF front end components (e.g., transceiver 406 or at least a transmitter 420 thereof). For example, the various operations related to power adjusting component 402 may be implemented or otherwise executed by one or more processors 403 and, in an aspect, can be executed by a single processor, while in other aspects, different ones of the operations may be executed by a combination of two or more different processors. For example, in an aspect, the one or more processors 403 may include any one or any combination of a modem processor, or a baseband processor, or a digital signal processor, or an application specific integrated circuit (ASIC), or a transmit processor, receive processor, or a transceiver processor associated with transceiver 406.

Further, for example, the memory 405 may be a non-transitory computer-readable medium that includes, but is not limited to, random access memory (RAM), read only memory (ROM), programmable ROM (PROM), erasable PROM (EPROM), electrically erasable PROM (EEPROM), a magnetic storage device (e.g., hard disk, floppy disk, magnetic strip), an optical disk (e.g., compact disk (CD), digital versatile disk (DVD)), a smart card, a flash memory device (e.g., card, stick, key drive), a register, a removable disk, and any other suitable medium for storing software and/or computer-readable code or instructions that may be accessed and read by a computer or one or more processors 403. Moreover, memory 405 or computer-readable storage medium may be resident in the one or more processors 403, external to the one or more processors 403, distributed across multiple entities including the one or more processors 403, etc. In addition, transceiver 406 may include one or more RF front end components, such as a transmitter 420 (and/or related processor), a receiver 422 (and/or related processor).

In particular, the one or more processors 403 and/or memory 405 may execute actions or operations defined by power adjusting component 402 or its subcomponents. For instance, the one or more processors 403 and/or memory 405 may execute actions or operations defined by a total power adjustment determining component 410 for determining a total power adjustment for transceiver 406 (e.g., for transmitter 420 or one or more associated power amplifiers (PA) 421), which can be based on detecting one or more parameters of an operating environment, received signal strengths of neighboring eNBs (e.g., eNB 450, 460), a command from a network entity (e.g., HeNB-GW 434), and/or the like. In an aspect, for example, total power adjustment determining component 410 may include hardware (e.g., one or more processor modules of the one or more processors 403) and/or computer-readable code or instructions stored in memory 405 and executable by at least one of the one or more processors 403 to perform the specially configured power adjustment determining operations described herein. Further, for instance, the one or more processors 403 and/or memory 405 may execute actions or operations defined by an adjustment size determining component 412 for determining an adjustment size for adjusting the power of the transceiver 406 in multiple adjustments to achieve the total power adjustment. In an aspect, for example, adjustment size determining component 412 may include hardware (e.g., one or more processor modules of the one or more processors 403) and/or computer-readable code or instructions stored in memory 405 and executable by at least one of the one or more processors 403 to perform the specially configured impairment image determination, filtering, separation, etc. operations described herein. Further, for instance, the one or more processors 403 and/or memory 405 may optionally execute actions or operations defined by DPD training component 414 for performing DPD training of the transceiver 406 to determine one or more coefficients and accordingly adjust one or more parameters of the transceiver 406 based on the coefficients (e.g., adjust a local oscillator of the transmitter 420, receiver 422, etc. to account for an I/Q imbalance determined based on the coefficients). In an aspect, for example, DPD training component 414 may include hardware (e.g., one or more processor modules of the one or more processors 403) and/or computer-readable code or instructions stored in memory 405 and executable by at least one of the one or more processors 403 to perform the specially configured DPD training operations described herein.

It is to be appreciated that transceiver 406 may be configured to transmit and receive wireless signals through one or more antennas, an RF front end, one or more transmitters, and one or more receivers. In an aspect, transceiver 406 may be tuned to operate at specified frequencies such that eNB 440 can communicate at a certain frequency. In an aspect, the one or more processors 403 may configure transceiver 406 to operate at a specified frequency and power level based on a configuration, a communication protocol, etc. to communicate uplink signals and/or downlink signals, respectively, over related uplink or downlink communication channels.

In an aspect, transceiver 406 can operate in multiple bands (e.g., using a multiband-multimode modem, not shown) such to process digital data sent and received using transceiver 406. In an aspect, transceiver 406 can be multiband and be configured to support multiple frequency bands for a specific communications protocol. In an aspect, transceiver 406 can be configured to support multiple operating networks and communications protocols. Thus, for example, transceiver 406 may enable transmission and/or reception of signals based on a specified modem configuration.

FIG. 5 illustrates an example method 500 for adjusting power of an RF transceiver of a wireless device. Method 500 includes, at Block 502, determining a total power adjustment for adjusting a transmit power of an RF transceiver. In an aspect, total power adjustment determining component 410, e.g., in conjunction with processor(s) 403 and/or memory 405, may determine the total power adjustment for adjusting the transmit power of the RF transceiver (e.g., transceiver 406 and/or related transmitter 420). For example, total power adjustment determining component 410 can determine the total power adjustment based at least in part on one or more observed environmental conditions. In one example, total power adjustment determining component 410 can determine the total power adjustment as part of performing a self-organizing network (SON) procedure based on determining transmit power (e.g., and/or received signal strength power) of neighboring eNBs (e.g., eNB 450, 460). For example, the SON procedure may be performed by the eNB 440 and/or in conjunction with a centralized entity (e.g., HeNB-GW 434) to allow eNB 440 and neighboring eNBs (e.g., eNB 450, 460) to operate at transmit powers such to avoid interference with one another, which may be based on negotiation of transmit power among the eNBs, determining, by each eNB and/or by HeNB-GW 434, a transmit power that does not result in a threshold interference to the one or more neighboring eNBs, etc. In addition, in an example, total power adjustment determining component 410 can determine the total power adjustment based on a determined load at the eNB 440, a number of UEs 115 accessing the eNB, and/or substantially any command received at or generated by the eNB 440 to adjust transmit power, etc. If the transmit power of the transceiver 406 is adjusted based on the total power adjustment in one adjustment, transmitting according to the adjusted transmit power by the transceiver 406 may violate ACLR restrictions of the corresponding RAT (e.g., at least when transmitting signals based on predisortion coefficients determined in previous DPD training).

Accordingly, method 500 may also include, at Block 504, adjusting the transmit power to a first adjusted transmit power based at least in part on a first adjustment size that is less than the total power adjustment. In an aspect, adjustment size determining component 412, e.g., in conjunction with processor(s) 403, memory 405, and/or transceiver 406, may adjust the transmit power to the first adjusted transmit power based at least in part on the first adjustment size that is less than the total power adjustment. In an example, the first adjustment size may be determined based at least in part on a current transmit power for the RF transceiver 406. In addition, adjusting the transmit power according to the first adjustment size less than the total power adjustment can ensure transmission at the first adjusted transmit power does not violate ACLR restrictions at the RAT. In one specific example, the first adjustment size can be between 0.5 and 3.0 decibel-milliwatts (dBm).

In an example, adjusting the transmit power at Block 504 may optionally include, at Block 506, determining the first adjustment size as a adjustment size that does not result in an emission specification violation. In an aspect, adjustment size determining component 412, e.g., in conjunction with processor(s) 403, memory 405, and/or transceiver 406, may determine the first adjustment size as an adjustment size that does not result in an emission specification (e.g., ACLR) violation. For example, adjustment size determining component 412 can determine the first and/or additional adjustment sizes based on a current transmit power. For example, adjustment size determining component 412 can determine the first and/or additional adjustment sizes with a goal to maintain absolute emission level (e.g., measured in dBm) compliant to a final output power ACLR when transitioning to higher transmit power and compliant to an initial ACLR when transitioning to lower transmit power. For example, a rationale may be that interference during transition would be no higher than either before or after.

In a specific non-limiting example, transitioning the transmit power from +20 dBm to +24 dBm in licensed band where ACLR limit is 45 dB, emissions in the ACLR region during transitioning the transmit power may be no higher than +24 dBm-45 dB=−21 dBm. If the first adjustment size is 1 dB, then for first adjustment, ACLR limit=21 dBm-(−21 dBm)=42 dB. If a next adjustment size is also 1 dB, then ACLR limit=22 dBm-(−21 dBm)=43 dB. In another specific non-limiting example, adjustment size determining component 412 can determine 2 dB as the first adjustment size, if after 2 dB transition, ACLR is no higher than 43 dB. For example, in transition from +24 dBm to 20 dBm, absolute emissions in ACLR region may be no higher than +24 dBm-45 dB=−21 dBm. If adjustment size determining component 412 determines the first adjustment as 1 dB, then ACLR limit=23 dBm-(−21 dBm)=44 dB. If adjustment size determining component 412 determines the first adjustment as 2 dB, then ACLR limit=22 dBm-(−21 dBm)=43 dB. In another example, adjustment size determining component 412 may possibly use larger adjustment sizes in the beginning of transitioning the transmit power to the total power adjustment, as initial ACLR requirements may be relaxed relative to final ones.

In another example, adjusting the transmit power at Block 504 may also optionally include, at Block 508, determining a configured adjustment size from a LUT configured for the RF transceiver. In an aspect, adjustment size determining component 412, e.g., in conjunction with processor(s) 403, memory and/or 405, may determine the configured adjustment size from the LUT (e.g., LUT 424) or some other indexed array configured for the RF transceiver (e.g., transceiver 406). For example, memory 405 can store the LUT 424, which may be a LUT configured by a network operator adjusting a PA 421 to effectuate transmit power adjusts, a LUT configured in accordance with aspects described herein specifying maximum adjustment sizes for current transmit powers to ensure ACLR restrictions are not violated, etc. In an example, the LUT 424 may include adjustment size values for total power (e.g., $\Delta_{Total}$), analog power (e.g., $\Delta_{Analog}$), and digital power (e.g., $\Delta_{Digital}$), where the corresponding values represent the largest adjustment size values allowed at a corresponding power level, and where $\Delta+>0$, and $\Delta-<0$. In an example, LUT 424 can include one or more of Tables 1 or 2 shown below:

TABLE 1 a LUT for when P_target is determined to be less than P_Current
LUT: P_target > P_current

| P_current | $\Delta_{Total}$ + | DPD training? | $\Delta_{Analog}$ + $\Delta_{Digital}$ + | $\Delta_{Digital}$ − |
|---|---|---|---|---|
| P0 = P_Min | | | | |
| P1 | | | | |
| P2 | | | | |
| ... | | | | |
| P_N = P_Max | | | | |

TABLE 2 a LUT for when P_target is determined to be less than P_Current
LUT: P_target > P_current

| P_current | $\Delta_{Total}$ − | DPD training? | $\Delta_{Analog}$ − $\Delta_{Digital}$ + | $\Delta_{Digital}$ − |
|---|---|---|---|---|
| P0 = P_Min | | | | |
| P1 | | | | |
| P2 | | | | |
| ... | | | | |
| P_N = P_Max | | | | |

As described, the LUT 424 can be populated by a network operator provisioning the eNB 440 based on a PA 421 used in the transceiver 406, where P_Current is the current transmit power configured of transceiver 406, and P_Target is the total power adjustment to be applied to P_Current. In addition, it is to be appreciated, in an example, that each power (e.g., P1, P2, P_N) can be in substantially equally spaced increments, though other arrangements are possible as well. Accordingly, for example, adjustment size determining component 412 can determine the values of $\Delta_{Total}$, $\Delta_{Analog}$, and $\Delta_{Digital}$ from the LUT 424, and use the values in determining adjustments for adjusting the transmit power based on the total power adjustment. In another example, adjustment size determining component 412 can compare the values with what is possible from calibration data (e.g., the coefficients from the DPD training). In this example, adjustment size determining component 412 can accordingly determine the analog and digital gain adjustment sizes to apply to the transceiver 406 such that utilizing the analog and/or digital transmit power with the gain adjustment sizes applied does not violate the |Δ| limits. In general, for example, adjustment size determining component 412 can attempt to determine the adjustment size (can be less than or equal to $|\Delta_{Total}|$) using the least possible analog gain changes (e.g., smallest possible $|\Delta_{Analog}|$) since typically this may result in the least change in the PA 421 non-linearity and hence the least risk of violating ACLR while training DPD for the new gain/PA 421 changes.

Moreover, the LUT 424 can specify whether DPD training is recommended for the current transmit power P_Current, and DPD training component 414 may accordingly not perform DPD training in adjusting the transmit power, and may instead use DPD pass-through coefficients in adjusting the transmit power, as described further herein. In another example, power adjusting component 402 may ignore the recommendation in the LUT 424, and can perform the power adjustment and DPD training as described herein.

Method 500 can also include, at Block 510, performing DPD training of the RF transceiver based on the first adjusted transmit power. In an aspect, DPD training component 414, e.g., in conjunction with processor(s) 403, memory 405, and/or transceiver 406, may perform DPD training of the RF transceiver 406 based on the first adjusted transmit power. For example, after adjustment size determining component 412 adjusts the transmit power by the first adjustment size, DPD training component 414 can perform DPD training to compute updated coefficients to account for I/Q imbalance, as described. Accordingly, RF transceiver 406 can apply the coefficients to generate pre-distorted signals in communications by RF transceiver 406, as described. Moreover, as described, by adjusting the transmit power by the first adjustment size, as opposed to the total power adjustment, the RF transceiver 406 may not violate ACLR restrictions of the RAT at least in subsequently performing DPD training by DPD training component 414 to update the coefficients in view of the adjusted transmit power.

Method 500 may also include, at Block 512, adjusting the first adjusted transmit power to a second adjusted transmit power based at least in part on a second adjustment size that is less than the total power adjustment. In an aspect, adjustment size determining component 412, e.g., in conjunction with processor(s) 403, memory 405, and/or transceiver 406, can adjust the first adjusted transmit power to a second adjusted transmit power based at least in part on the second adjustment size that is less than the total power adjustment. For example, adjusting the first adjusted transmit power, in this regard, can occur after the DPD training based on the first adjusted transmit power. As described with respect to adjusting the power at Block 504, adjustment size determining component 412 can determine the second adjustment size as a function of the first adjusted transmit power, based on determining that the second adjustment size does not result in ACLR violation, based on determining a configured adjustment size for the first adjusted transmit power from a LUT, etc.

Method 500 may also optionally include, at Block 514, performing DPD training of the RF transceiver based on the second adjusted transmit power. In an aspect, DPD training component 414, e.g., in conjunction with processor(s) 403, memory 405, and/or transceiver 406, may perform DPD training of the RF transceiver based on the second adjusted transmit power. As described with respect to performing DPD training at Block 510, DPD training component 414 may perform the DPD training to update I/Q imbalance coefficients for generating predistorted signals based on the second adjusted transmit power to update the coefficients given the power adjustment. It is to be appreciated that method 500 can include additional adjustment and DPD training adjustments until the total power adjustment is achieved.

Method 500 optionally includes, at Block 516, determining whether a transmit power of a RF transceiver achieves a threshold, where determining the total power adjustment at Block 502 may be based on whether the transmit power achieves the threshold. In an aspect, power adjusting component 402, e.g., in conjunction with processor(s) 403 and/or memory 405, can determine whether the transmit power of the RF transceiver (e.g., transceiver 406 and/or associated transmitter 420, etc.) achieves the threshold. For example, where the transmit power achieves the threshold, method 500 can be performed as described above. Where, however, the transmit power does not achieve the threshold, in this example, method 500 may optionally include, at Block 518, adjusting the transmit power of the RF transceiver to a total power adjustment. In an aspect, power adjusting component 402, e.g., in conjunction with processor(s) 403, memory 405, and/or transceiver 406, may adjust the transmit power of the RF transceiver 406 to the total power adjustment without performing power adjustment in multiple adjustment sizes.

In an example, the threshold may be stored in memory 405 as a configuration parameter, received in a configuration from HeNB-GW 434 or other network entities for operating in the wireless network, etc. For example, the threshold may relate to the transmit power below which DPD may be safely disabled as it is not needed due to prior knowledge that the PA 421 in use by transceiver 406 may exhibit linear behavior below such power level. In addition, the threshold may relate to the transmit power below which it is unlikely to run a successful DPD training due to insufficient power/gain on a feedback (FB) path of the transceiver 406, since the transmit power is relatively low.

An example state diagram 600 is shown in FIG. 6, which illustrates state transitioning of power adjusting component 402 in determining whether to use adjustment size power adjustment for a total power adjustment. For example, at state 602, the eNB 440 can power up or reboot. At state 604, the power adjusting component 402 can determine that a current transmit power is less than the threshold for performing DPD, as described above. In transitioning to this state 604 from state 602, power adjusting component 402 can use DPD pass-through coefficients in performing a total power adjustment can be used, where the DPD pass-through coefficients can be scaled to a desired gain with an adaptive transmit power control (ATPC) command. At state 606, the power adjusting component 402 can determine that a current transmit power is greater than the threshold for performing DPD, as described above. In this example, in transitioning to this state 606 from state 602, power adjusting component 402 can perform a DPD training request (e.g., via DPD training component 414). At state 608, the power adjusting component 402 can determine that a current transmit power is equal to the threshold for performing DPD, as described above. In this example, in transitioning to this state 608 from state 602, power adjusting component 402 can similarly perform a DPD training request.

In remaining in state 604 where a total power adjustment is determined, power adjusting component 402 can use direct ATPC gain change command to adjust the transmit power to the total power adjustment in one adjustment (e.g., similar to Blocks 516 and 518 in method 500). In transitioning from state 604 to state 608, power adjusting component 402 can use DPD training (e.g., via DPD training component 414) and can change the power in one adjustment (e.g., similar to Blocks 516 and 518 in method 500). In transitioning from state 608 back to state 604, power adjusting component 402 can similarly set the DPD coefficients to pass-through coefficients, and use direct ATPC gain change to adjust the transmit power in one adjustment (e.g., similar to Blocks 516 and 518 in method 500), as described. In remaining in state 608 where a total power adjustment is determined, power adjusting component 402 can use DPD training (e.g., via DPD training component 414). In transitioning from state 608 to state 606, power adjusting component 402 can use DPD training (e.g., via DPD training component 414) with incremental power adjusting (e.g., similar to Blocks 504 to 512 in method 500). In remaining in state 606 where a total power adjustment is determined, power adjusting component 402 can use DPD training (e.g., via DPD training component 414) with incremental power adjusting (e.g., similar to Blocks 504 to 512 in method 500). In transitioning from state 606 back to state 608, power adjusting component 402 can use DPD training (e.g., via DPD training component 414) with incremental power adjusting (e.g., similar to Blocks 504 to 512 in method 500).

FIG. 7 illustrates an example method 700 for adjusting power of an RF transceiver of a wireless device. For example, method 700 can be a specific example of method 500. Method 700 can include, at Block 702, determining current transmit power (P_Current) and determine and/or set a final target transmit power (P_Target). As described, in an aspect, total power adjustment determining component 410 can determine the current transmit power and determine and/or set the final target transmit power. As described, for example, total power adjustment determining component 410 may determine the current transmit power from a SON procedure, and may set the target transmit power as the current transmit power plus a total power adjustment and/or as a target power specified from the SON procedure. Thus, for example, determining the total power adjustment at Block 502 of FIG. 5 may optionally include determining P_Current and determining and/or setting P_Target at Block 702.

Method 700 can also include, at Block 704, determining whether the final target transmit power (P_Target) is equal to the current transmit power (P_Current). Power adjusting component 402 can determine whether P_Target=P_Current, and if so, method 700 can end. If not, however, method 700 can include, at Block 706, determining whether the final target transmit power (P_Target) is greater than the current transmit power (P_Current). Power adjusting component 402 can determine whether P_Target>P_Current, and if so, method 700 can also include, at Block 708, determining, from a power change LUT, a adjustment size D, determined as the minimum of either $\Delta_{Total}+$ from the LUT for P_Current or P_Target+P_Current, and computing (e.g., using calibration data based on previous DPD training and the power change LUT), analog gain, digital gain, and determining whether DPD training is 1 or 0 for P_Current. In an aspect, adjustment size determining component 412 can determine, from the power change LUT (e.g., LUT 424), a adjustment size D, determined as the minimum of either $\Delta_{Total}+$ from the LUT 424 for P_Current or P_Target+P_Current, and can compute (e.g., using calibration data based on previous DPD training and the power change LUT), analog gain, digital gain, and determining whether DPD training is 1 or 0 for P_Current in the LUT 424. In an example, determining the first adjustment size at Block 506 or the configured adjustment size at Block 508 of FIG. 5 may include determining the minimum value at Block 708.

If P_Target is not greater than P_Current at Block 706, method 700 can also include, at Block 710, determining, from a power change LUT, a adjustment size D, determined as the maximum of either $\Delta_{Total}$– from the LUT for P_Current or P_Current–P_Target, and computing (e.g., using calibration data based on previous DPD training and the power change LUT), analog gain, digital gain, and determining whether DPD training is 1 or 0 for P_Current. In an aspect, adjustment size determining component 412 can determine, from the power change LUT (e.g., LUT 424), a adjustment size D, determined as the maximum of either $\Delta_{Total}$– from the LUT for P_Current or P_Current–P_Target, and can compute (e.g., using calibration data based on previous DPD training and the power change LUT), analog gain, digital gain, and determining whether DPD training is 1 or 0 for P_Current in the LUT 424. In an example, determining the first adjustment size at Block 506 or the configured adjustment size at Block 508 of FIG. 5 may include determining the maximum value at Block 708.

In either case, method 700 may also include, at Block 712, determining whether DPD training=1. In an aspect, DPD training component 414 can determine whether DPD training in the LUT 424 is equal to 1 for P_Current. If so, method 700 may include, at Block 714, triggering DPD training and applying analog gain and digital gain accordingly. In an aspect, DPD training component 414 can trigger DPD training, as described above, and can apply the analog gain and digital gain to predistort signals to correct I/Q imbalance. For example, performing DPD training at Block 510 of FIG. 5 may include triggering DPD training at Block 714. If DPD training is not equal to 1, method 700 may include, at Block 716, not triggering DPD training and applying analog gain and digital gain accordingly. In an aspect, DPD training component 414 can refrain from triggering DPD training, and can apply analog and digital gain accordingly (e.g., using DPD pass-through coefficients, as described).

In either case, method 700 also includes, at Block 718, determining whether P_Current plus adjustment size D=P_Target. Power adjusting component 402 can determine whether P_Current plus adjustment size D=P_Target. If so, method 700 includes, at Block 722, setting P_Current=P_Current+D. In an example, adjusting the transmit power at Block 504 of FIG. 5 may include setting P_Current at Block 722. Power adjusting component 402 can set P_Current=P_Current+D. If setting P_Current+D does not equal P_Target, method 700 includes, at Block 724, setting P_Current=P_Current+D and proceeding to Block 706 to determine whether P_Target>P_Current. In an example, adjusting the transmit power at Block 504 of FIG. 5 may include setting P_Current at Block 722.

Figure 8:
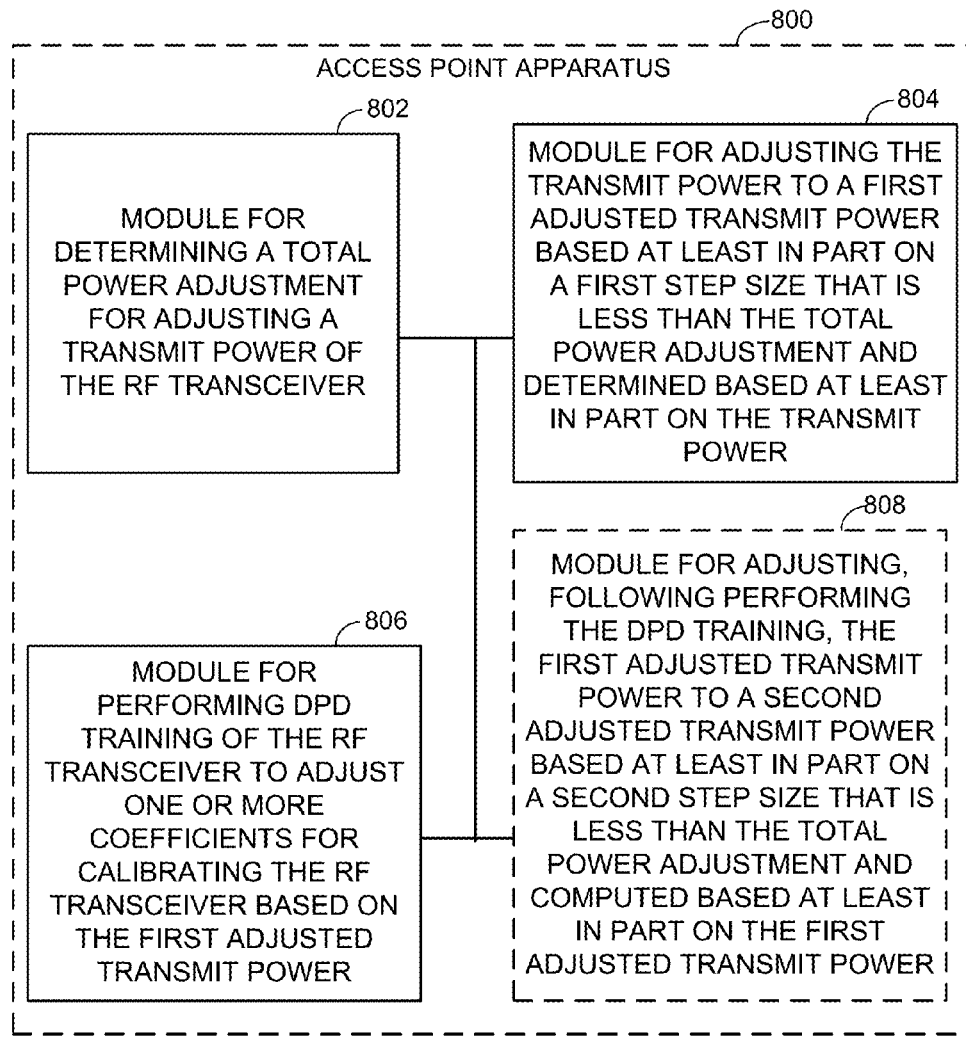
FIG. 8 is a block diagram of several sample aspects of apparatuses configured in accordance with aspects described herein.

FIG. 8 illustrates an example access point apparatus 800 represented as a series of interrelated functional modules. A module for determining a total power adjustment for adjusting a transmit power of the RF transceiver 802 may correspond at least in some aspects to, for example, a processing system or communication device (e.g., a receiver, transceiver, etc.), as discussed herein. A module for adjusting the transmit power to a first adjusted transmit power based at least in part on a first adjustment size that is less than the total power adjustment and determined based at least in part on the transmit power 804 may correspond at least in some aspects to, for example, a processing system or communication device (e.g., a receiver, transceiver, etc.), as discussed herein. A module for performing DPD training of the RF transceiver to adjust one or more coefficients for calibrating the RF transceiver based on the first adjusted transmit power 806 may correspond at least in some aspects to, for example, a processing system or communication device (e.g., a receiver, transceiver, etc.), as discussed herein. A module for adjusting, following performing the DPD training, the first adjusted transmit power to a second adjusted transmit power based at least in part on a second adjustment size that is less than the total power adjustment and computed based at least in part on the first adjusted transmit power 808 may correspond at least in some aspects to, for example, a processing system or communication device (e.g., a receiver, transceiver, etc.), as discussed herein The functionality of the modules of FIG. 8 may be implemented in various ways consistent with the teachings herein. In some aspects, the functionality of these modules may be implemented as one or more electrical components. In some aspects, the functionality of these blocks may be implemented as a processing system including one or more processor components. In some aspects, the functionality of these modules may be implemented using, for example, at least a portion of one or more integrated circuits (e.g., an ASIC). As discussed herein, an integrated circuit may include a processor, software, other related components, or some combination thereof. Thus, the functionality of different modules may be implemented, for example, as different subsets of an integrated circuit, as different subsets of a set of software modules, or a combination thereof. Also, it should be appreciated that a given subset (e.g., of an integrated circuit and/or of a set of software modules) may provide at least a portion of the functionality for more than one module.

In addition, the components and functions represented by FIG. 8 as well as other components and functions described herein, may be implemented using any suitable means. Such means also may be implemented, at least in part, using corresponding structure as taught herein. For example, the components described above in conjunction with the "module for" components of FIG. 8 also may correspond to similarly designated "means for" functionality. Thus, in some aspects one or more of such means may be implemented using one or more of processor components, integrated circuits, or other suitable structure as taught herein.

It is understood that the specific order or hierarchy of steps in the processes disclosed is an illustration of example approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described herein that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method, performed by a device, for adjusting transmit power of a radio frequency (RF) transceiver, comprising:
   determining a total power adjustment for adjusting a transmit power of the RF transceiver;
   adjusting the transmit power to a first adjusted transmit power based at least in part on a first adjustment size that is less than the total power adjustment and determined based at least in part on the transmit power;
   performing digital pre-distortion (DPD) training of the RF transceiver to adjust one or more coefficients for calibrating the RF transceiver based on the first adjusted transmit power; and
   adjusting, following performing the DPD training, the first adjusted transmit power to a second adjusted transmit power based at least in part on a second adjustment size that is less than the total power adjustment and computed based at least in part on the first adjusted transmit power.

2. The method of claim 1, further comprising performing a second DPD training of the RF transceiver to adjust the one or more coefficients for calibrating the RF transceiver based on the second adjusted transmit power.

3. The method of claim 2, further comprising adjusting, following performing the second DPD training, the second adjusted transmit power to a third adjusted transmit power based at least in part on a third adjustment size that is less than the total power adjustment and computed based at least in part on the second adjusted transmit power.

4. The method of claim 1, further comprising determining the first adjustment size as a largest adjustment size that does not violate an emission specification for a radio access technology (RAT) based at least in part on at least one of the transmit power or the one or more coefficients.

5. The method of claim 4, wherein the RAT is one of long term evolution (LTE) or universal mobile telecommunications system (UMTS).

6. The method of claim 1, further comprising:
   determining a configured adjustment size from a look-up table configured for the RF transceiver;
   determining whether adjusting the transmit power by the configured adjustment size violates an emission specification;
   setting the first adjustment size as the configured adjustment size based on determining that adjusting the transmit power by the configured adjustment size does not violate the emission specification; and
   determining the first adjustment size as a largest adjustment size that does not the emission specification based on determining that adjusting the transmit power by the configured adjustment size does violate the emission specification.

7. The method of claim 6, wherein determining whether adjusting the transmit power by the configured adjustment size violates the emission specification comprises determining whether the configured adjustment size is greater than the first adjustment size.

8. The method of claim 1, wherein adjusting the transmit power to the first adjusted transmit power is based at least in part on determining that the transmit power of the RF transceiver achieves an initial threshold.

9. An apparatus for adjusting transmit power of a radio frequency (RF) transceiver, comprising:
   the RF transceiver;
   at least one processor communicatively coupled with the RF transceiver via a bus for communicating signals in a wireless network; and
   a memory communicatively coupled with the at least one processor and/or the RF transceiver via the bus;
   wherein the at least one processor and the memory are operable to:
      determine a total power adjustment for adjusting a transmit power of the RF transceiver;
      adjust the transmit power to a first adjusted transmit power based at least in part on a first adjustment size that is less than the total power adjustment and determined based at least in part on the transmit power;
      perform digital pre-distortion (DPD) training of the RF transceiver to adjust one or more coefficients for calibrating the RF transceiver based on the first adjusted transmit power; and
      adjust, following performing the DPD training, the first adjusted transmit power to a second adjusted transmit power based at least in part on a second adjustment size that is less than the total power adjustment and computed based at least in part on the first adjusted transmit power.

10. The apparatus of claim 9, wherein the at least one processor and the memory are further configured to perform a second DPD training of the RF transceiver to adjust the one or more coefficients for calibrating the RF transceiver based on the second adjusted transmit power.

11. The apparatus of claim 10, wherein the at least one processor and the memory are further configured to adjust, following performing the second DPD training, the second adjusted transmit power to a third adjusted transmit power based at least in part on a third adjustment size that is less than the total power adjustment and computed based at least in part on the second adjusted transmit power.

12. The apparatus of claim 9, wherein the at least one processor and the memory are further configured to determine the first adjustment size as a largest adjustment size that does not violate an emission specification for a radio access technology (RAT) based at least in part on at least one of the transmit power or the one or more coefficients.

13. The apparatus of claim 12, wherein the RAT is one of long term evolution (LTE) or universal mobile telecommunications system (UMTS).

14. The apparatus of claim 9, wherein the at least one processor and the memory are further configured to:
   determine a configured adjustment size from a look-up table configured for the RF transceiver;
   determine whether adjusting the transmit power by the configured adjustment size violates an emission specification;
   set the first adjustment size as the configured adjustment size based on determining that adjusting the transmit power by the configured adjustment size does not violate the emission specification; and
   determine the first adjustment size as a largest adjustment size that does not violate the emission specification based on determining that adjusting the transmit power by the configured adjustment size does violate the emission specification.

15. The apparatus of claim 14, wherein the at least one processor and the memory are configured to determine whether adjusting the transmit power by the configured adjustment size violates the emission specification at least in part by determining whether the configured adjustment size is greater than the first adjustment size.

16. The apparatus of claim 9, wherein the at least one processor and the memory are further configured to adjust the transmit power to the first adjusted transmit power based at least in part on determining that the transmit power of the RF transceiver achieves an initial threshold.

17. An apparatus for adjusting transmit power of a radio frequency (RF) transceiver, comprising:
hardware means for determining a total power adjustment for adjusting a transmit power of the RF transceiver;
hardware means for adjusting the transmit power to a first adjusted transmit power based at least in part on a first adjustment size that is less than the total power adjustment and determined based at least in part on the transmit power;
hardware means for performing digital pre-distortion (DPD) training of the RF transceiver to adjust one or more coefficients for calibrating the RF transceiver based on the first adjusted transmit power; and
hardware means for adjusting, following performing the DPD training, the first adjusted transmit power to a second adjusted transmit power based at least in part on a second adjustment size that is less than the total power adjustment and computed based at least in part on the first adjusted transmit power.

18. The apparatus of claim 17, further comprising means for performing a second DPD training of the RF transceiver to adjust the one or more coefficients for calibrating the RF transceiver based on the second adjusted transmit power.

19. The apparatus of claim 18, further comprising means for adjusting, following performing the second DPD training, the second adjusted transmit power to a third adjusted transmit power based at least in part on a third adjustment size that is less than the total power adjustment and computed based at least in part on the second adjusted transmit power.

20. The apparatus of claim 17, further comprising means for determining the first adjustment size as a largest adjustment size that does not violate an emission specification for a radio access technology (RAT) based at least in part on at least one of the transmit power or the one or more coefficients.

21. The apparatus of claim 17, further comprising:
means for determining a configured adjustment size from a look-up table configured for the RF transceiver;
means for determining whether adjusting the transmit power by the configured adjustment size violates an emission specification;
means for setting the first adjustment size as the configured adjustment size based on determining that means for adjusting the transmit power by the configured adjustment size does not violate the emission specification; and
means for determining the first adjustment size as a largest adjustment size that does not violate the emission specification based on determining that adjusting the transmit power by the configured adjustment size does violate the emission specification.

22. The apparatus of claim 21, wherein the means for determining whether adjusting the transmit power by the configured adjustment size violates the emission specification determines whether the configured adjustment size is greater than the first adjustment size.

23. The apparatus of claim 17, wherein the means for adjusting adjusts the transmit power to the first adjusted transmit power based at least in part on determining that the transmit power of the RF transceiver achieves an initial threshold.

24. A non-transitory computer-readable storage medium comprising computer-executable code for adjusting transmit power of a radio frequency (RF) transceiver, the code comprising:
code for determining a total power adjustment for adjusting a transmit power of the RF transceiver;
code for adjusting the transmit power to a first adjusted transmit power based at least in part on a first adjustment size that is less than the total power adjustment and determined based at least in part on the transmit power;
code for performing digital pre-distortion (DPD) training of the RF transceiver to adjust one or more coefficients for calibrating the RF transceiver based on the first adjusted transmit power; and
code for adjusting, following performing the DPD training, the first adjusted transmit power to a second adjusted transmit power based at least in part on a second adjustment size that is less than the total power adjustment and computed based at least in part on the first adjusted transmit power.

25. The non-transitory computer-readable storage medium of claim 24, further comprising code for performing a second DPD training of the RF transceiver to adjust the one or more coefficients for calibrating the RF transceiver based on the second adjusted transmit power.

26. The non-transitory computer-readable storage medium of claim 25, further comprising code for adjusting, following performing the second DPD training, the second adjusted transmit power to a third adjusted transmit power based at least in part on a third adjustment size that is less than the total power adjustment and computed based at least in part on the second adjusted transmit power.

27. The non-transitory computer-readable storage medium of claim 24, further comprising code for determining the first adjustment size as a largest adjustment size that does not violate an emission specification for a radio access technology (RAT) based at least in part on at least one of the transmit power or the one or more coefficients.

28. The non-transitory computer-readable storage medium of claim 24, further comprising:
code for determining a configured adjustment size from a look-up table configured for the RF transceiver;
code for determining whether adjusting the transmit power by the configured adjustment size violates an emission specification;
setting the first adjustment size as the configured adjustment size based on determining that code for adjusting the transmit power by the configured adjustment size does not violate the emission specification; and
code for determining the first adjustment size as a largest adjustment size that does not violate the emission specification based on determining that adjusting the transmit power by the configured adjustment size does violate the emission specification.

29. The non-transitory computer-readable storage medium of claim 28, wherein the code for determining whether adjusting the transmit power by the configured adjustment size violates the emission specification determines whether the configured adjustment size is greater than the first adjustment size.

30. The non-transitory computer-readable storage medium of claim 24, wherein the code for adjusting adjusts the transmit power to the first adjusted transmit power based at least in part on determining that the transmit power of the RF transceiver achieves an initial threshold.

\* \* \* \* \*